(12) United States Patent
Ingram et al.

(10) Patent No.: US 12,592,346 B2
(45) Date of Patent: Mar. 31, 2026

(54) MONOLITHIC MULTILAYERED CERAMIC CAPACITOR

(71) Applicant: KEMET Electronics Corporation, Simpsonville, SC (US)

(72) Inventors: Miles T. Ingram, Simpsonville, SC (US); John Bultitude, Simpsonville, SC (US); Randal J. Vaughan, Simpsonville, SC (US); Lonnie G. Jones, Simpsonville, SC (US); James T. Davis, Simpsonville, SC (US)

(73) Assignee: KEMET Electronics Corporation, Fort Lauderdale, FL (US)

( * ) Notice: Subject to any disclaimer, the term of this patent is extended or adjusted under 35 U.S.C. 154(b) by 235 days.

(21) Appl. No.: 18/221,091

(22) Filed: Jul. 12, 2023

(65) Prior Publication Data

US 2025/0022661 A1 Jan. 16, 2025

(51) Int. Cl.
| | |
|---|---|
| *H01G 4/38* | (2006.01) |
| *H01G 4/30* | (2006.01) |
| *H05K 1/181* | (2026.01) |

(52) U.S. Cl.
CPC ................ *H01G 4/38* (2013.01); *H01G 4/30* (2013.01); *H05K 1/181* (2013.01); *H05K 2201/10015* (2013.01)

(58) Field of Classification Search
CPC H01G 4/38; H01G 4/30; H05K 1/181; H05K 2201/10015
See application file for complete search history.

(56) References Cited

U.S. PATENT DOCUMENTS

| | | | | |
|---|---|---|---|---|
| 9,025,311 B1 * | 5/2015 | Bultitude | ................. | H01G 4/38 361/321.2 |
| 9,627,141 B2 | 4/2017 | Engel et al. | | |
| 9,875,851 B2 | 1/2018 | Engel et al. | | |
| 10,622,157 B2 | 4/2020 | Bultitude | | |
| 10,714,259 B2 | 7/2020 | Vaughan et al. | | |
| 11,410,816 B2 | 8/2022 | Itamochi | | |
| 2004/0223290 A1 * | 11/2004 | Sutardja | ................... | H01G 4/40 361/306.3 |
| 2005/0286204 A1 * | 12/2005 | Yamaguchi | .......... | H01G 4/0085 361/301.5 |
| 2007/0096254 A1 | 5/2007 | Ritter et al. | | |
| 2007/0133147 A1 * | 6/2007 | Ritter | .................... | H01G 4/232 361/309 |
| 2014/0016243 A1 * | 1/2014 | Suzuki | ................. | H01G 4/1209 501/135 |
| 2014/0311785 A1 * | 10/2014 | Park | ......................... | H01G 4/30 361/301.4 |

(Continued)

*Primary Examiner* — Michael P Mcfadden

(74) *Attorney, Agent, or Firm* — Joseph T. Guy; Patent Filing Specialist Inc.

(57) ABSTRACT

Provided is a monolithic multilayered ceramic capacitor comprising multiple capacitive couples encased in a continuous ceramic. The continuous ceramic further comprises a ceramic separator between adjacent capacitive couples. Each capacitive couple comprises active electrodes wherein first active electrodes of adjacent active electrodes of each capacitive couple are in electrical contact with a first external termination and second active electrodes of adjacent active electrodes of each capacitive couple are in electrical contact with a second external termination.

40 Claims, 12 Drawing Sheets

(56)                         References Cited

U.S. PATENT DOCUMENTS

| 2016/0099107 A1* | 4/2016 | Lee .......................... H01G 4/30 |
| | | 361/301.4 |
| 2016/0111216 A1* | 4/2016 | Lee ....................... H01G 4/232 |
| | | 361/301.4 |
| 2016/0268044 A1* | 9/2016 | Gu ........................... H01G 4/12 |
| 2018/0012706 A1* | 1/2018 | Bultitude ................. H01G 4/33 |
| 2018/0137977 A1 | 5/2018 | Vaughan et al. |
| 2020/0118757 A1 | 4/2020 | Kageyama |
| 2020/0243259 A1* | 7/2020 | Berolini ................... H01G 4/12 |
| 2020/0243260 A1* | 7/2020 | Berolini ................... H01G 4/30 |
| 2020/0243261 A1* | 7/2020 | Berolini ................ H01G 4/232 |
| 2020/0243264 A1* | 7/2020 | Berolini .............. G01R 31/016 |
| 2020/0243265 A1* | 7/2020 | Berolini ................... H01G 4/12 |
| 2020/0273949 A1 | 8/2020 | Bultitude et al. |
| 2021/0082620 A1* | 3/2021 | Lee ..................... H01G 4/1218 |

* cited by examiner

MONOLITHIC MULTILAYERED CERAMIC CAPACITOR

FIELD OF THE INVENTION

The present invention is related to monolithic multilayered ceramic capacitors and, more specifically, monolithic MultiLayered Ceramic Capacitors (MLCC's) having improved properties.

BACKGROUND

Multilayered ceramic capacitors are widely used throughout the electronics industry. Advancements in the electronics devices, and increases in the capabilities provided by electronic devices, have required the ongoing demand for increased functionality and improved volumetric efficiency.

There has been no shortage of efforts seeking to meet the demands of increased functionality and improved volumetric efficiency which are often contradictory. One such effort has been focused on form factor wherein individual MLCC's are assemble as stacks and mounted to a circuit board as a stacked unit either with a common lead or as a leadless stack. While advantageous, further miniaturization of the MLCC's complicates the assembly process resulting in increased cost and issues related to alignment and bond integrity between individual MLCC's.

In spite of these advancements there is still a desire for improvements in capacitors and particularly in multilayered ceramic capacitors, capacitor assemblies and electronic assemblies. Provided herein is a significant improvement in the manufacture of monolithic multilayered ceramic capacitors and improved monolithic multilayered ceramic capacitors provided thereby. Also provided herein are improved electronic assemblies which are available due to the improved monolithic multilayered ceramic capacitors.

SUMMARY OF THE INVENTION

It is an object of the invention to provide an improved monolithic multilayered ceramic capacitor and an electronic device comprising the improved monolithic multilayered ceramic capacitor.

A particular feature of the invention is an increase in volumetric efficiency compared to leaded and leadless stacks as well as more capacitance being realized within an available circuit board area in addition to improved physical and electrical properties.

A particular advantage is the ability to manufacture the improved monolithic multilayered ceramic capacitor using conventional manufacturing techniques typically utilized for the formation of multilayered ceramic capacitors.

These and other advantages, as will be realized, are provided in a monolithic multilayered ceramic capacitor comprising multiple capacitive couples encased in a continuous ceramic. The continuous ceramic further comprises a ceramic separator between adjacent capacitive couples. Each capacitive couple comprises active electrodes wherein first active electrodes of adjacent active electrodes of each capacitive couple are in electrical contact with a first external termination and second active electrodes of adjacent active electrodes of each capacitive couple are in electrical contact with a second external termination.

Yet another embodiment is provided in an electronic device comprising a circuit board comprising traces. A monolithic multilayered ceramic capacitor is provided comprising at least one capacitive couple comprising active electrodes wherein adjacent active electrodes are in electrical contact with separate external terminations. Each external termination is on a surface of the monolithic multilayered ceramic capacitor and each external termination is in electrical contact with a separate trace. The active electrodes are in at least one parallel stack separated by ceramic and active electrodes are perpendicular to the circuit board.

DESCRIPTION

The present invention is related to improved monolithic multilayered ceramic capacitors and an improved method of forming monolithic multilayered ceramic capacitors. More particularly the present invention is related to improvements in electronic devices resulting from the enhanced properties provided by the monolithic multilayered ceramic capacitors.

More specifically, the present invention is related to monolithic multilayered ceramic capacitors which can be provided with multiple independent capacitive couples within a common monolithic body or which have a significantly improved aspect ratio, relative to termination, wherein the improved aspect ratio provides significant improvements in the electronic device formed therewith.

The invention will be described with reference to the figures which are an integral, but non-limiting, part of the specification provided for clarity of the invention. Throughout the various figures similar elements will be numbered accordingly.

Figure 1:
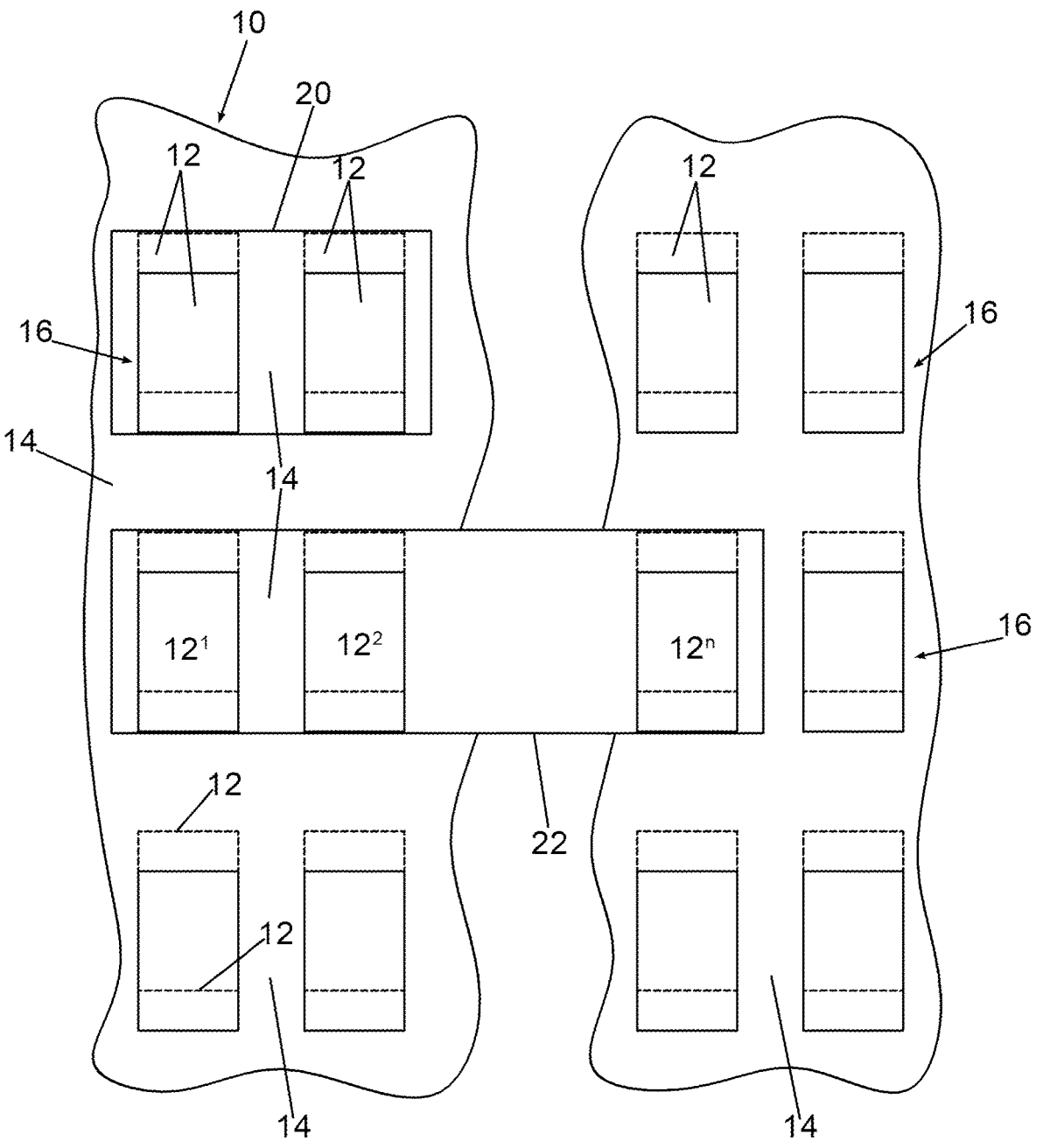
FIG. 1 is a schematic top, partial cut-away representation of an embodiment of the invention.

An embodiment of the invention will be described with reference to FIG. 1. In FIG. 1 a laminate, 10, is illustrated schematically in top, partial cut-away, view. The laminate is formed comprising alternating layers of active electrodes, 12, wherein adjacent electrodes in a capacitive couple, 16, are parallel and offset as will be further described herein. Ceramic, 14, is between adjacent electrodes of a capacitive couple and between capacitive couples as will be more fully described herein. A cut-line, 20, separates a 2-C monolithic body comprising two capacitive couples, 16, with a ceramic dielectric separator, 14, there between as will be more fully appreciated from further discussion. A cut-line, 22, separates a n-C monolithic body comprising n capacitive couples, 16, with a ceramic dielectric separator, 14, there between whereas n is the number of capacitive couples in the monolithic body, as will be more fully appreciated from further discussion, wherein n is an integer from 0 to 20, more preferably 0 to 15, even more preferably 0 to 10, even more preferably 0 to 5 with 0 or 1 being most preferable. As would be realized an n value of 0 to 20 represents to 22 capacitive couples with the other recitations of values for n being the number of capacitive couples above 2. For the purposes of discussion and clarification the term "n-C monolithic body" denotes a continuous monolithic body have n capacitive couples. As would be realized the active electrodes of each capacitive couple are coplanar with the active electrodes of adjacent capacitive couples. More preferably, each active electrode of a capacitive couple is coplanar with an active electrode of each additional capacitive couple.

Figure 2:
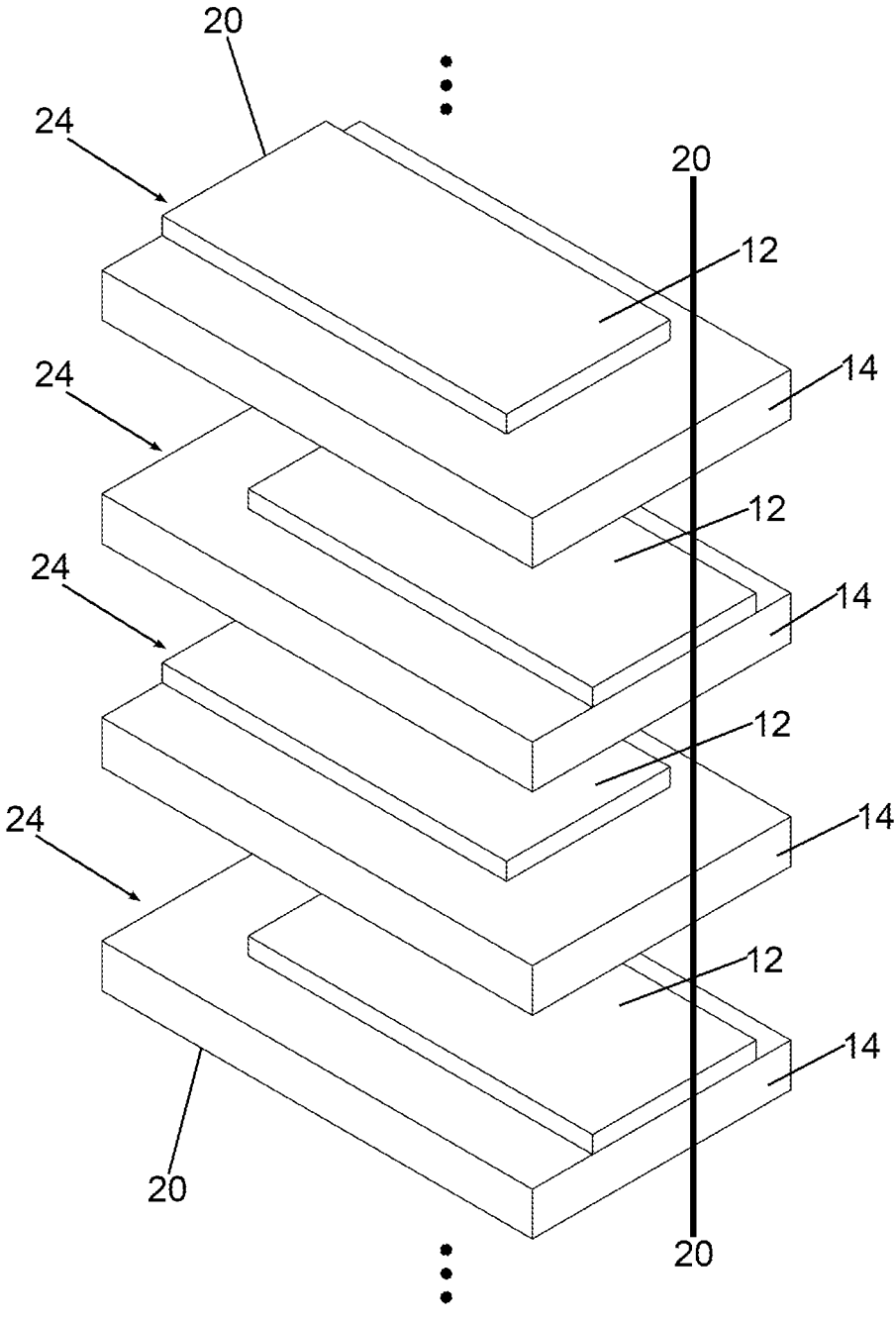
FIG. 2 is an isolated schematic exploded representation of an embodiment of the invention.

A portion of a single capacitive couple is illustrated in isolated schematic exploded view in FIG. 2 for clarity. In FIG. 2, each layer, 24, comprises ceramic, 14, with an active electrode, 12, formed thereon as well known in the art. The layers are stacked with alternate active electrodes offset such that alternate active electrodes terminate at opposite cut lines, 20. As would be well understood to those of skill in the art cutting, dicing or separating at the cut line exposes adjacent active electrodes. An external termination is formed on the face in electrical contact with the active electrodes thereby forming a multilayered ceramic capacitor as known in the art. Though a limited number of layers are shown in the figures, for the purposes of clarity and visibility, the actual number can be quite large. As would be realized to those of skill in the art at least two layers are necessary to form a capacitive couple with many hundreds of layers being used in practice.

Figure 3:
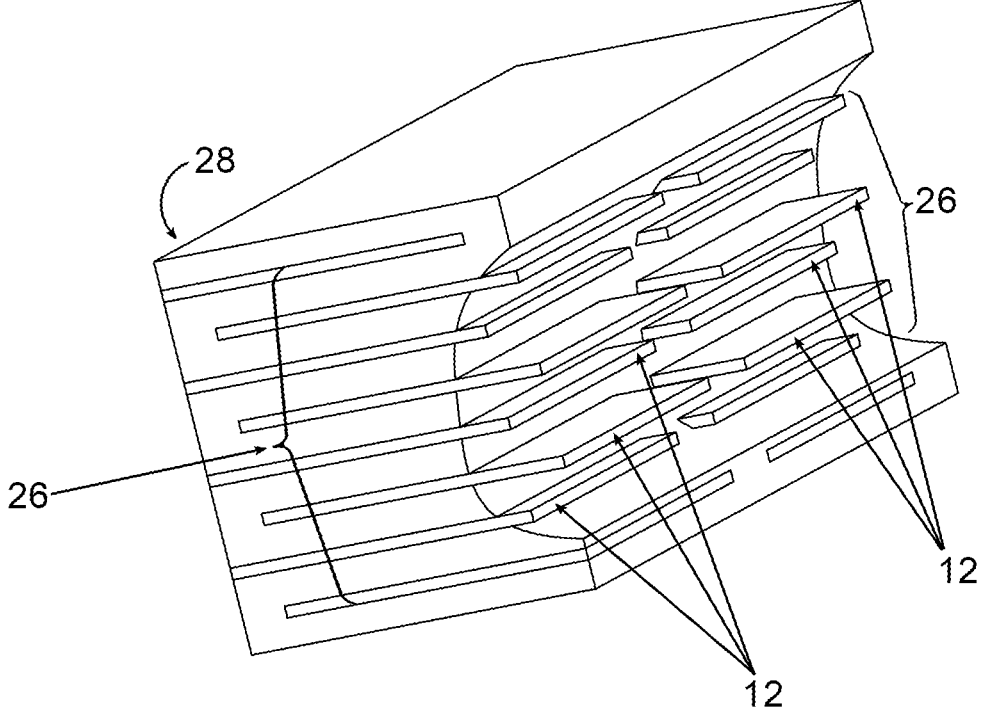
FIG. 3 is a schematic perspective shadow representation of an embodiment of the invention.
Figure 4:
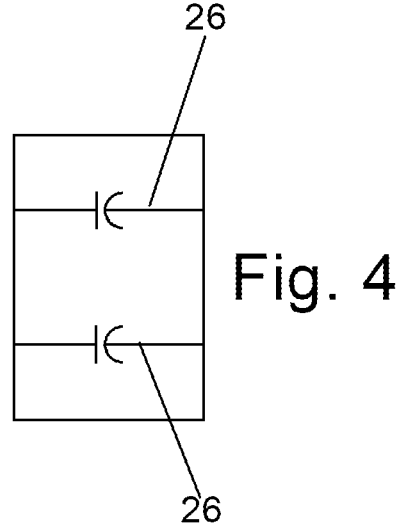
FIG. 4 is an electrical schematic diagram of an embodiment of the invention.

An embodiment of the invention will be described with reference to FIG. 3 wherein a 2-C monolithic body is represented in schematic perspective shadow view illustrated as a monolithic body without external terminations. The 2-C monolithic body of FIG. 3 is representative of that achieved by separating along cut line 20 of FIG. 1. In FIG. 3, two capacitive couples, 26, are formed by independent stacks of active electrodes, 12, wherein alternate active electrodes have ceramic there between and extend to the opposite faces, 28, upon which an external termination will be formed. The capacitive couples, 26, are separated by ceramic and therefore the completed capacitor is represented by the electrical schematic diagram of FIG. 4.

Figure 5:
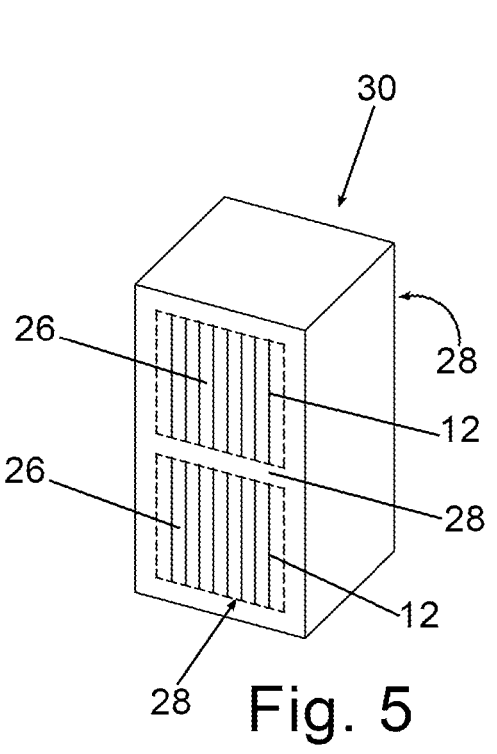
FIG. 5 is a schematic representation of an embodiment of the invention.
Figure 6:
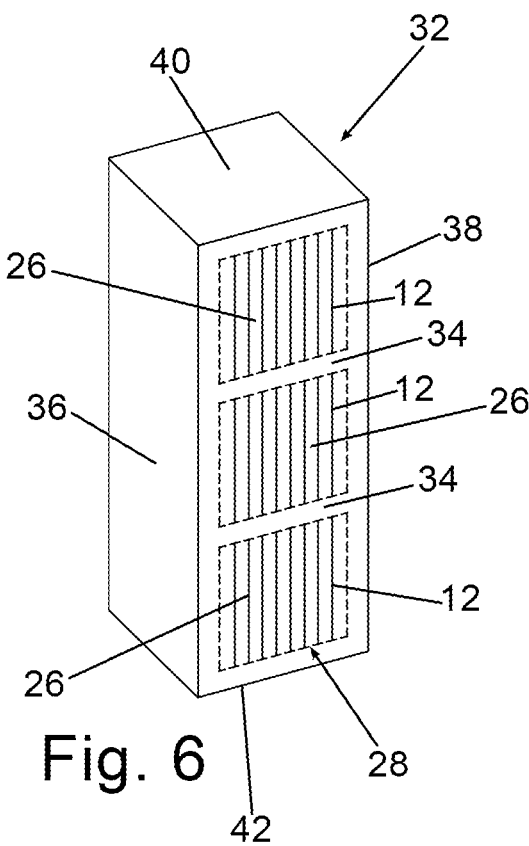
FIG. 6 is a schematic representation of an embodiment of the invention.

An embodiment of the invention will be described with reference to FIGS. 5 and 6. FIG. 5 illustrates a representative embodiment as a 2-C monolithic body comprising two capacitive couples, as will be described further herein. FIG. 6 illustrates a representative embodiment as a 3-C monolithic body, as will be described further herein. For the purposes of illustration and discussion the monolithic bodies of FIGS. 5 and 6 are not terminated. In FIG. 5, a 2-C monolithic body, 30, is illustrated schematically wherein the 2-C monolithic body comprises two capacitive couples, 26, containing inner electrodes 12, with a ceramic separator, 34, formed there between. As would be realized the ceramic separator is that portion of ceramic between adjacent stacks as illustrated in FIG. 1. In FIG. 6, a 3-C monolithic body, 32, is illustrated schematically wherein the 3-C monolithic body comprises three capacitive couples, 26, containing inner electrodes 12, with a ceramic separator, 34, between adjacent capacitive couples. The collection of capacitive couples is circumnavigated by a continuous ceramic dielectric box comprising a first side, 36, second side, 38, which is parallel to the first side, a top, 40, which is perpendicular to, and continuous with, the first side and second side and a bottom 42, which is parallel to the top and perpendicular to, and continuous with, the first side and second side. The faces, 28, showing alternate exposed electrodes, do not have a ceramic covering. As would be realized, the opposite face is identical to the visible face with the exception of the alternate adjacent electrodes being exposed. The ceramic of the monolithic multilayered ceramic capacitor is continuous which is defined herein to indicate no dislocations or bonding of separately formed ceramic. The entire ceramic encasing the capacitive couples is preferable formed from continuous ceramic precursor.

Figure 7:
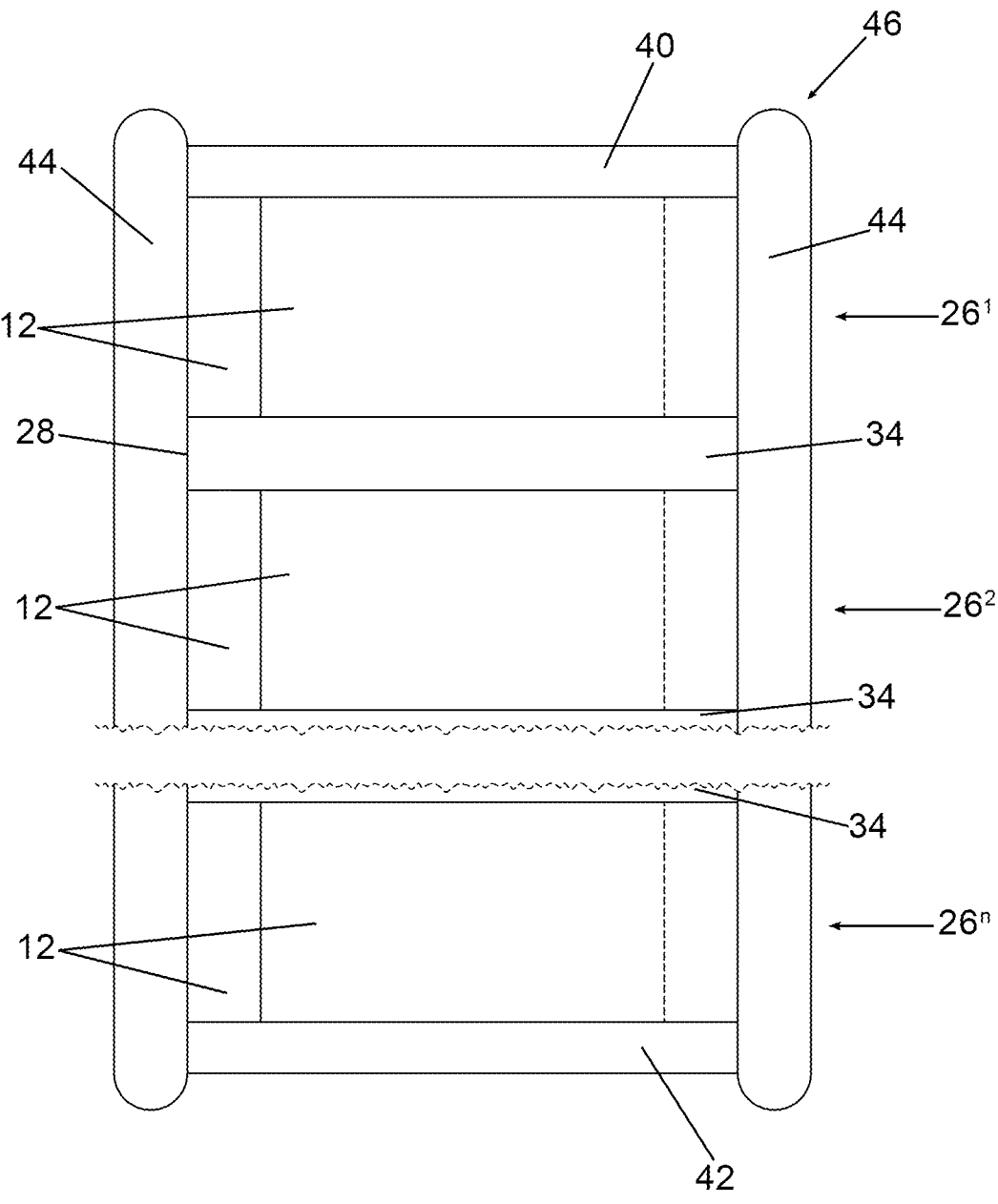
FIG. 7 is a schematic cross-sectional representation of an embodiment of the invention.
Figure 8:
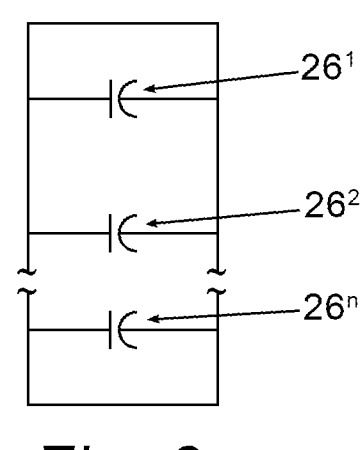
FIG. 8 is an electrical schematic diagram of an embodiment of the invention.

An embodiment of the invention will be described in cross-sectional schematic view in FIG. 7. In FIG. 7, each stack of offset active electrodes, 12, forms a capacitive couple, 26. A top, 40, and bottom, 42, encase the capacitive couples and ceramic separators, 34, electrically isolate the capacitive couples. External terminations, 44, on each exposed face, 28, of the monolith provides electrical conductivity of the capacitive couple to a circuit. As would be realized each external termination is in electrical contact with alternate active electrodes, therefore of opposite polarity, resulting in the monolithic multilayered ceramic capacitor, 46, comprising n separate capacitive couples encased in a common continuous ceramic with ceramic separator between adjacent capacitive couples wherein the ceramic insulator is continuous with the encasing ceramic represented by the top, 40, bottom, 42, and sides which are not visible in this view. The monolithic multilayered ceramic capacitor, 46, of FIG. 7 would have n capacitive couples wherein n is an integer from 0 to 10, more preferably 0 to 5 and most preferably 0 or 1. For nonlimiting clarification when n is 0 the monolithic multilayered ceramic capacitor is a 2-C monolithic body and when n is 1 the monolithic multilayered ceramic capacitor is a 3-C monolithic body. The monolithic multilayered ceramic capacitor of FIG. 7 would have an electrical schematic diagram illustrated in FIG. 8.

Figure 9:
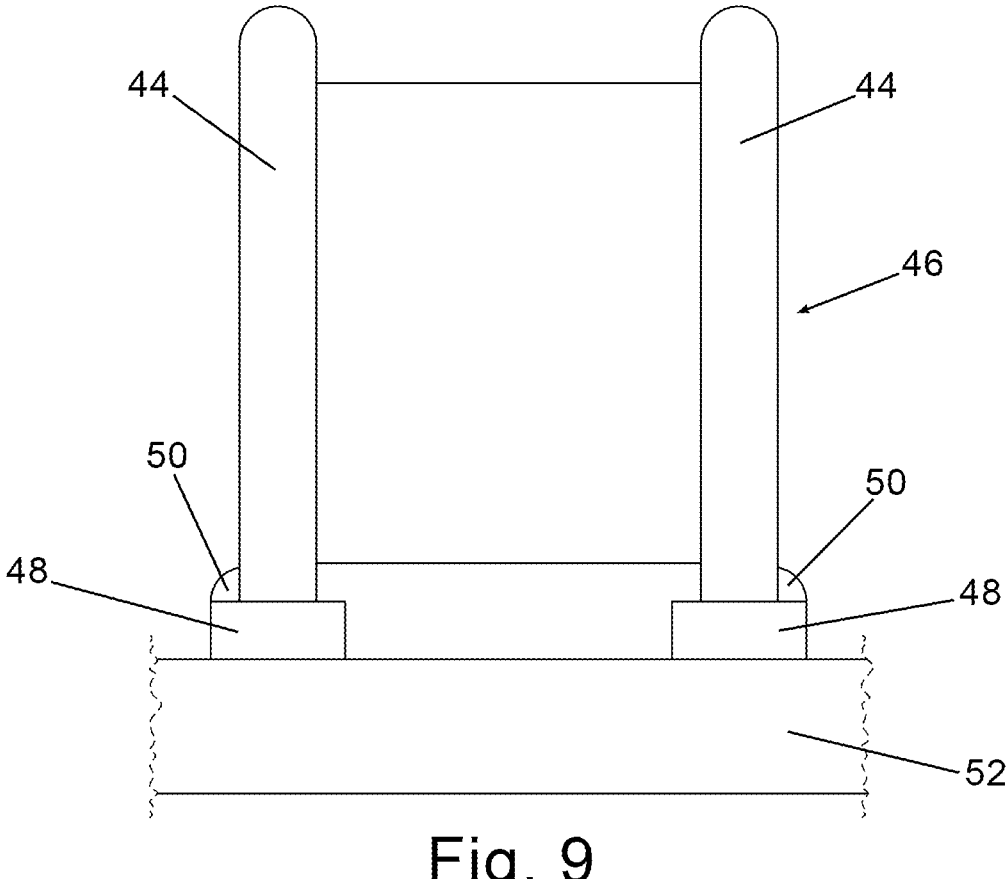
FIG. 9 is a schematic side view representation of an embodiment of the invention.

A particular feature of the inventive monolithic multilayered ceramic capacitor is the ability to mount the device with all active electrodes perpendicular to the substrate. An embodiment of the invention will be described with reference to FIG. 9 wherein a monolithic multilayered ceramic capacitor, 46, is illustrated mounted to a circuit board, 52. As would be realized from the description herein, the monolithic multilayered ceramic capacitor, representing an n-C monolithic body, has external terminations, 44, as discussed above. Each external termination is in electrical contact with a trace, 48, preferably attached by a solder fillet, 50, or similar attachment method. As would be realized, and illustrated in FIG. 7, the active electrodes can all be perpendicular to the circuit board. Advantages of mounting the monolithic multilayered ceramic capacitor with the active electrodes perpendicular to the circuit board include a lower ESR which leads to less heating during use with alternating current (AC) application. Mounting the monolithic multilayered ceramic capacitor with the active electrodes perpendicular to the circuit board also results in lower ESL resulting in less inductive losses.

The inventive monolithic multilayered ceramic capacitor is compatible with other MLCC technology including shield electrodes and floating electrodes.

Figure 10:
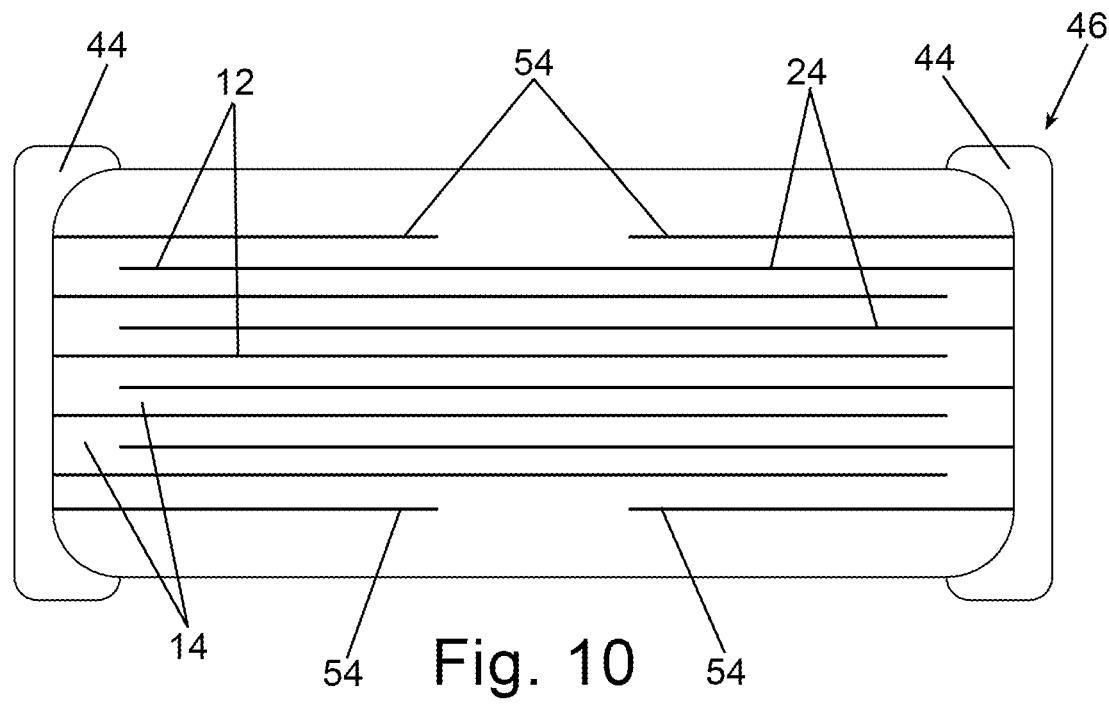
FIG. 10 is a schematic cross-sectional representation of an embodiment of the invention.

An embodiment of the invention will be described with reference to FIG. 10 wherein a cross-sectional schematic view of a monolithic multilayered ceramic capacitor is illustrated. In FIG. 10, the monolithic multilayered ceramic capacitor, 46, comprises active electrodes, 12, with ceramic, 14, as a dielectric between the internal electrodes. Shield electrodes, 54, are illustrated wherein shield electrodes are defined as coplanar active electrodes of opposite polarity positioned as the outermost internal electrodes in the monolith. Shield electrodes are in electrical contact with the external termination and inhibit arcing from the external termination to the active electrode of opposite polarity. Shield electrodes do not contribute significantly to capacitance and preferably span the length of the monolith from the first side to the second side as defined herein.

Figure 11:
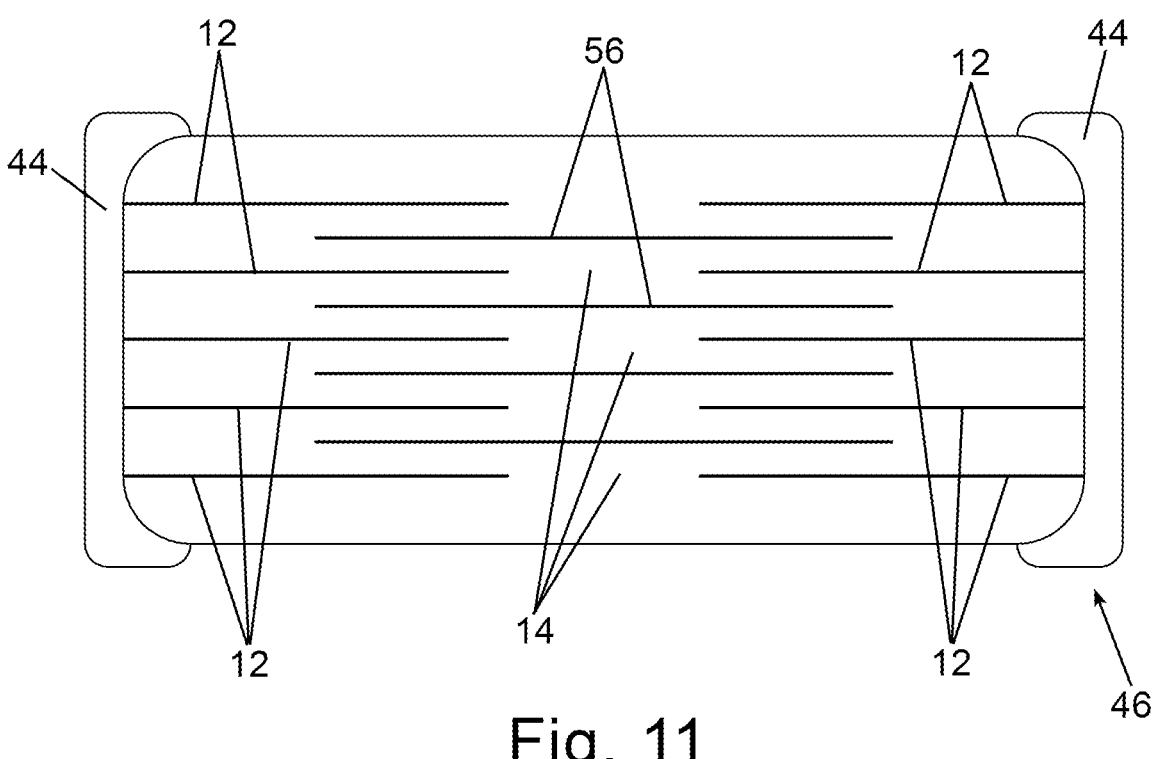
FIG. 11 is a schematic cross-sectional representation of an embodiment of the invention.

An embodiment of the invention will be described with reference to FIG. 11 wherein a cross-sectional schematic view of a monolithic multilayered ceramic capacitor is illustrated. In FIG. 11 the monolithic multilayered ceramic capacitor, 46, comprises coplanar active electrodes, 12, of opposite polarity with floating electrodes, 56, in a plane parallel to the coplanar active internal electrodes and preferably each floating electrode has coplanar active internal electrodes adjacent to each side. Ceramic, 14, between adjacent electrodes functions as the dielectric. An active electrode is defined herein as an internal electrode which is in electrical contact with an external termination. A floating electrode is an internal electrode which is not in electrical contact with an external termination. Floating electrodes are within a capacitive couple.

A particular advantage of the n-C monolithic body is an increased volumetric efficiency compared to stacked MLCCs as well as realizing higher capacitance per unit area. Avoiding the use of leads to bond multiple capacitors together, or the formation of a leadless stack, eliminates failure modes of each. Many of the failure modes of stacked capacitors, whether using leads or leadless, is a failure of the bond due to thermal or mechanical stress. The instant invention avoids bonds between discrete capacitors.

Figure 12:
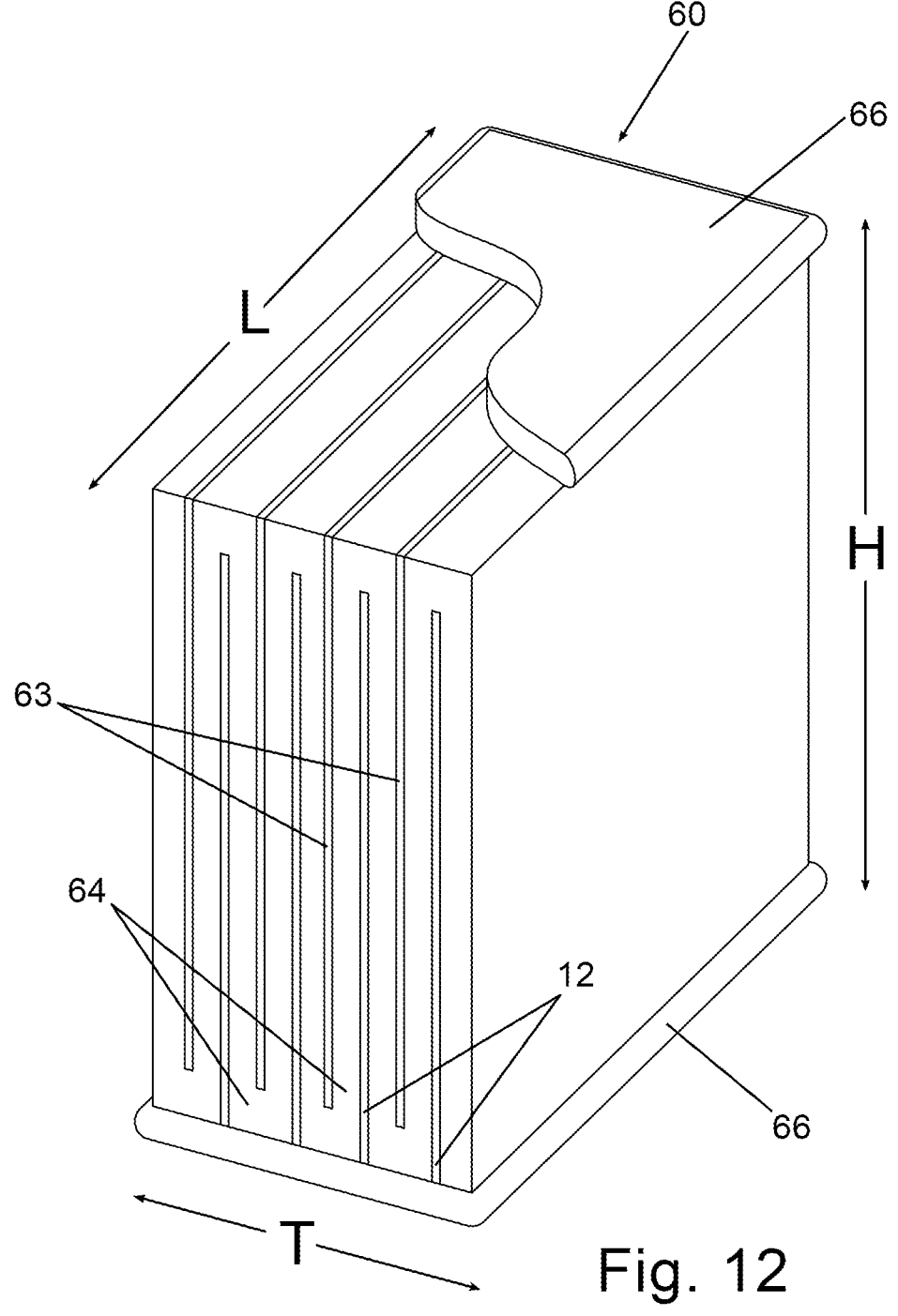
FIG. 12 is a schematic perspective, partial cut-away representation of an embodiment of the invention.
Figure 13:
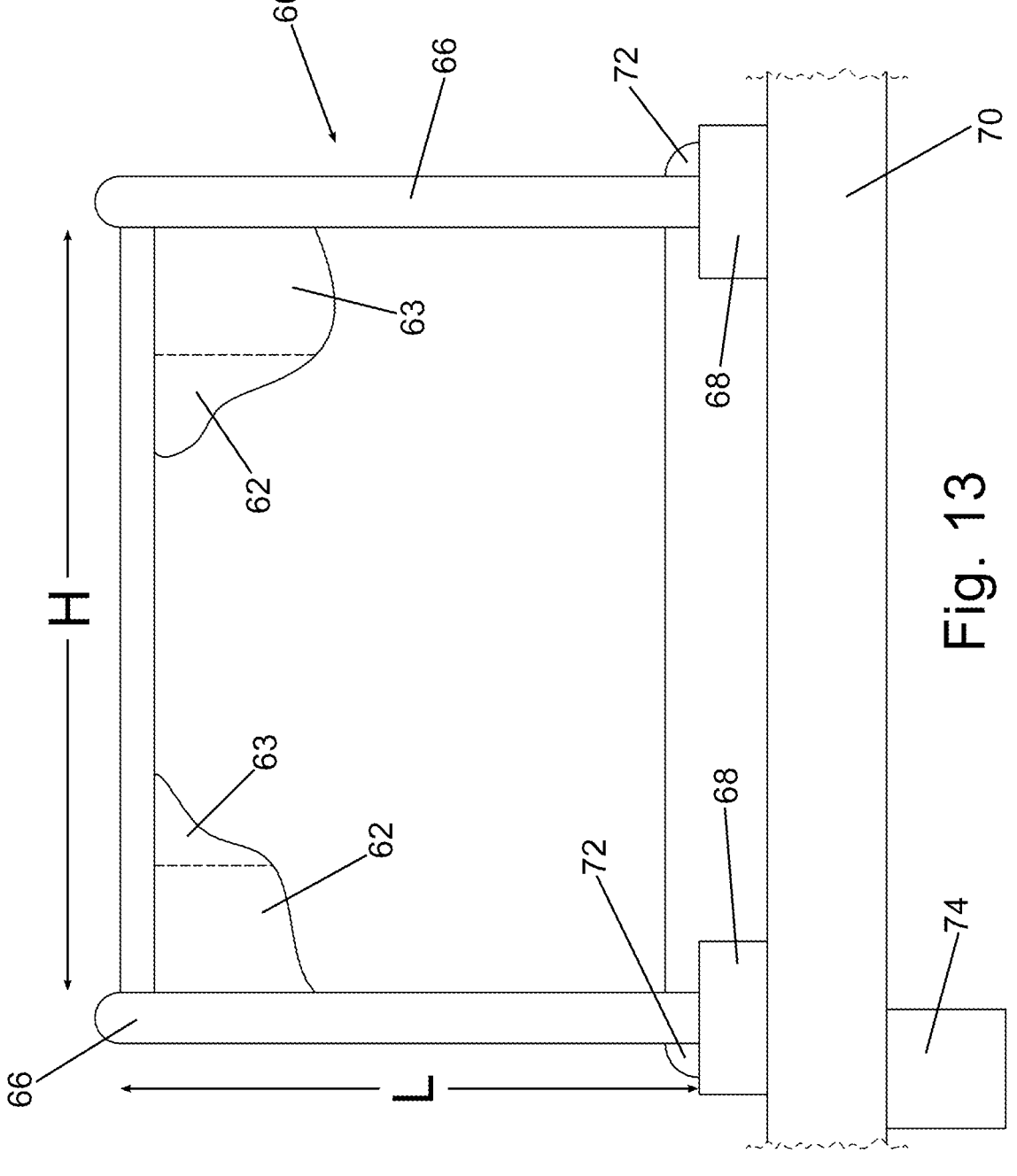
FIG. 13 is a schematic side perspective, partial cut-away representation of an embodiment of the invention.

An embodiment of the invention will be described with reference to a FIG. 12. In FIG. 12, a monolithic multilayered ceramic capacitor, 60, is illustrated in schematic partial cut-away perspective view. The monolith has a length L, a height H and a thickness T, wherein the ratio $L/T \geq 1$, $L/H \geq 1$ and T/H is at least 0.3 to no more than 0.9 when assembled in the circuit board as shown in FIG. 13. In FIG. 12 the dielectric, 64, is between adjacent electrodes as would be realized. The thickness T of the capacitor is not necessary limited but is highlighted for the purposes of orientation and discussion. Adjacent active electrodes, 62 and 63, terminate at opposite faces and therefore alternate electrodes are in electrical contact with opposite external terminations, 66.

An advantage of the embodiment illustrated in FIG. 12 will be discussed with reference to FIG. 13. In FIG. 13 a monolithic multilayered ceramic capacitor, 60, is illustrated to be in electrical contact with circuit traces, 68, on a circuit board, 70, such as by solder fillets, 72. The circuit board is integral to an electronic device, 74, wherein the traces are preferably coplanar. By mounting the monolithic multilayered ceramic capacitor to the circuit board with the active electrodes perpendicular to the circuit board multiple advantages are realized as detailed above. Having the monolithic multilayered ceramic capacitor mounted to the circuit board with the active electrodes perpendicular to the circuit board is contrary to the art wherein it is considered necessary to maximize the amount of external termination surface area in electrical contact with the circuit board to minimize ESR and ESL. By minimizing the ESR lower AC ripple current heating can be realized since the power dissipated $P=I^2ESR$ and lower ESL reduces circuit resonance issues.

Figure 15:
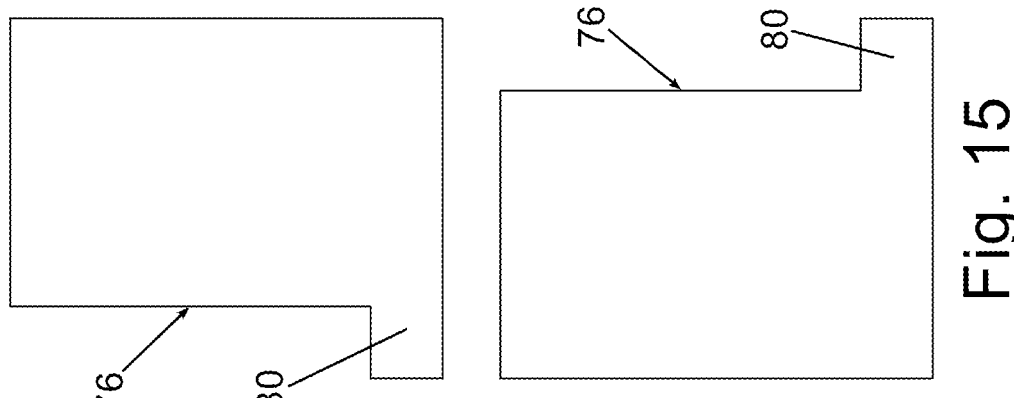
FIG. 15 is a representation of an embodiment of the invention.
Figure 14:
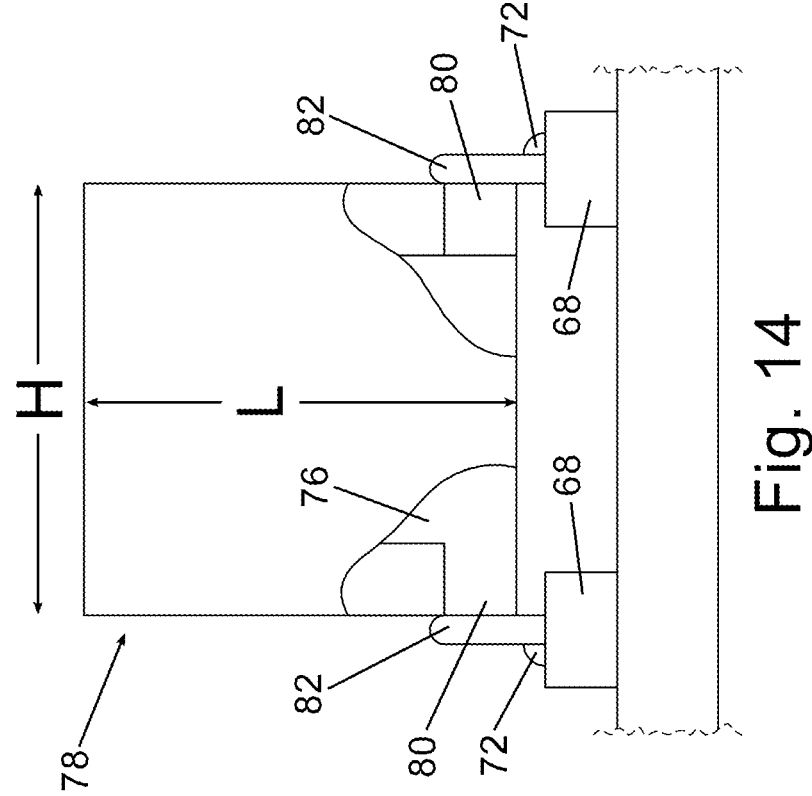
FIG. 14 is a schematic side perspective, partial cut-away representation of an embodiment of the invention.

An embodiment of the invention will be described with reference to FIGS. 14 and 15. In FIG. 14, a monolithic multilayered ceramic capacitor, 78, is illustrated to be in electrical contact with circuit traces, 68, on a circuit board, 70, such as by solder fillets, 72. Partial external terminations, 82, are illustrated wherein the partial external termination is defined as an external termination which does not extend the length L of the monolith. A partial external termination is advantageous since the risk of electrical arcing from the top portion of the monolithic multilayered ceramic capacitor to a secondary component is mitigated. A particular advantage of the use of partial external terminations is the ability to utilize active electrodes comprising a tab, 80, wherein the tab extends to the exterior of the monolith. As would be realized adjacent tabs are oriented with the tab extending in opposite directions.

The ceramic circumnavigating the collection of capacitive couples, and the separator between adjacent capacitive couples, has sufficient thickness to avoid current flow between adjacent capacitive couples or arcing between electrodes of a capacitive couple and external components. More specifically, the ceramic circumnavigating the collection of capacitive couples, and the separator, is thicker than the distance between adjacent parallel electrodes in an adjacent capacitive couple and more preferably at least twice the distance between adjacent parallel electrodes in a capacitive couple.

Multi-layer ceramic capacitors (MLCC) are formed by interleaving thin layers of ceramic insulator electrodes of opposed polarity and co-sintering to produce a monolithic component. The layering process requires the ceramic and electrode to be suspended in organic media. In general, the ceramic and metal layers are alternately cast, by one of a myriad of techniques, to form a monolith which is first heated to remove volatiles and then sintered as a monolith.

MLCC's are prepared by sequentially layering ceramic precursors and conductor precursors in appropriate registration as known in the art. After a sufficient number of layers are built up the assembly is heated to form alternating layers of internal conductors and sintered ceramic.

The ceramic material used as a dielectric is not particularly limited herein. Materials suitable for use in this monolithic ceramic capacitor are free of Pb and comprises at least 92% by weight of barium, calcium, strontium, magnesium, potassium or sodium titanates, zirconates, niobates or tantalates and combinations thereof. Dielectrics that meet the EIA temperature coefficient of capacitance designations of C0G, U2J, X8G, X9G, X7R, X5R, X6S, X7T or X8R capacitors are particularly suitable for use in the demonstration of the present invention due to their wide spread use in the manufacture of MLCC's.

Each dielectric layer has a preferred thickness of up to about 50 μm, more preferably up to about 20 μm. The lower limit of thickness is about 0.5 μm, preferably about 2 μm. The number of dielectric layers, and active layers, stacked is generally from 2 to about 2000, preferably from 2 to about 450.

The conductor which forms the internal electrode layers is not limited herein, although a base metal is preferably used since the dielectric material of the commonly employed dielectric layers typically has anti-reducing properties. Typical base metals are nickel and nickel alloys. Preferred nickel alloys are alloys of nickel with at least one member selected from Mn, Cr, Co, Al, W, Mo, Sn and Nb with such nickel alloys containing at least 95 wt % of nickel being more preferred. It is to be noted that nickel and nickel alloys may contain up to about 0.1 wt % of phosphorous and other trace components. Other conductors which may be employed as internal electrodes include copper, precious metals or alloys thereof with particularly preferred precious metals selected from palladium, silver, platinum and gold. It would be understood that with copper or precious metal containing internal electrodes lower temperature firing is preferred.

The thickness of the internal electrode layers may be suitably determined in accordance with a particular purpose and application although the upper limit is typically about 25 $\mu$m, more preferably about 2.5 $\mu$m, and the lower limit is typically about 0.5 $\mu$m. Most preferable is a thickness of about 1 $\mu$m.

The conductor which forms the external terminations is not particularly limited, although inexpensive metals such as nickel, copper, and alloys thereof are preferred. The thickness of the external terminations may be suitably determined in accordance with a particular purpose and application although it generally ranges from about 10 $\mu$m to about 50 $\mu$m. In one embodiment a conductive metal, preferably silver, filled epoxy termination is utilized as a termination.

The multilayer ceramic chip capacitor of the present invention is generally fabricated by forming a green chip by conventional printing and sheeting methods using pastes. After firing and separating of the chip, or monolith, the external terminations, also referred to as external electrodes, are formed by printing, or transferring, precursors of the external termination onto the surface, in contact with the internal electrodes terminating at the surface, followed by baking.

Paste for forming the dielectric layers can be obtained by mixing a raw dielectric material with an organic vehicle. The raw dielectric material may be a mixture of oxides and composite oxides. Also useful are various compounds which convert to such oxides and composite oxides upon firing. These include, for example, carbonates, oxalates, nitrates, hydroxides, and organometallic compounds. The dielectric material is obtained by selecting appropriate species from these oxides and compounds and mixing them. The proportion of such compounds in the raw dielectric material is determined such that after firing, the specific dielectric layer composition may be met. The raw dielectric material is generally used in powder form having a mean particle size of about 0.1 to about 3 $\mu$m, preferably about 0.5 $\mu$m.

Paste for forming internal electrode layers is obtained by mixing an electro-conductive material with an organic vehicle. The conductive material used herein includes conductors such as conductive metals and alloys as mentioned above and various compounds which convert into such conductors upon firing, for example, oxides, organometallic compounds and resinates. The binder used herein is not critical and may be suitably selected from conventional binders such as ethyl cellulose. Also, the organic solvent used herein is not critical and may be suitably selected from conventional organic solvents such as terpineol, butylcarbinol, acetone, and toluene in accordance with a particular application method such as a printing or sheeting method.

Paste for forming external electrodes, also referred to as external terminations, is prepared by the same method as the internal electrodes, also referred to as active electrode, layer-forming paste.

No particular limit is imposed on the organic vehicle content of the respective pastes. Often the paste contains about 1 to 5 wt % of the binder and about 10 to 50 wt % of the organic solvent. If desired, pastes may contain any other additives such as dispersants, plasticizers, dielectric compounds, and insulating compounds. The total content of these additives is preferably up to about 10 wt %.

A green chip may be prepared from the dielectric layer-forming paste and the internal electrode layer-forming paste. In the case of a printing method, a green chip is prepared by alternately printing the pastes onto a substrate of polyethylene terephthalate (PET), for example, to form a laminar stack, cutting the laminar stack to a predetermined shape and separating it from the substrate.

Also useful is a sheeting method wherein a green chip is prepared by forming green sheets from the dielectric layer-forming paste, printing the internal electrode layer-forming paste on the respective green sheets, and stacking the printed green sheets. A capacitor with a large number of layers can be prepared in this manner as well known in the art.

The method of forming the capacitor is not particularly limiting herein.

The binder is removed from the green chip and fired. Binder removal may be carried out under conventional conditions, preferably under the conditions where the internal electrode layers are formed of a base metal conductor such as nickel and nickel alloys.

For binder removal the heating rate is preferably about 5 to 300° C./hour, more preferably 10 to 100° C./hour. The holding temperature is preferably about 200 to 400° C., more preferably 250 to 300° C. and the holding time is preferably about ½ to 24 hours, more preferably 5 to 20 hours in air. An inert or reducing atmosphere may be provided at temperatures exceeding 225° C. to limit oxidation of the internal electrodes. The green chip is fired in an atmosphere which may be determined in accordance with the type of conductor in the internal electrode layer-forming paste. Where the internal electrode layers are formed of a base metal conductor such as nickel and nickel alloys, the firing atmosphere may have an oxygen partial pressure of $10^{-8}$ to 10-12 atm. Extremely low oxygen partial pressure should be avoided, since at such low pressures the conductor can be abnormally sintered and may become disconnected from the dielectric layers. At oxygen partial pressures above the range, the internal electrode layers are likely to be oxidized.

For firing, the chip preferably is held at a temperature of 1,100° C. to 1,400° C., more preferably 1,250 to 1,400° C. Lower holding temperatures below the range would provide insufficient densification whereas higher holding temperatures above the range can lead to poor DC bias performance. The heating rate is preferably 50 to 500° C./hour, more preferably 200 to 300° C./hour with a holding time of ½ to 8 hours, more preferably 1 to 3 hours. The cooling rate is preferably 50 to 500° C./hour, more preferably 200 to 300° C./hour. The firing atmosphere preferably is a reducing atmosphere. An exemplary atmospheric gas is a humidified mixture of $N_2$ and $H_2$ gases.

Firing of the capacitor chip in a reducing atmosphere is preferably followed by annealing. Annealing is effective for re-oxidizing the dielectric layers, thereby optimizing the resistance of the ceramic to dielectric breakdown. The annealing atmosphere may have an oxygen partial pressure of at least $10^{-6}$ atm., preferably $10^{-5}$ to $10^{-4}$ atm. The dielectric layers are not sufficiently re-oxidized at low oxygen partial pressures below the range whereas the internal electrode layers are likely to be oxidized at oxygen partial pressures above this range.

For annealing, the chip is preferably held at a temperature of lower than 1,100° C., more preferably 500° C. to 1,000° C. Lower holding temperatures below this range would oxidize the dielectric layers to a lesser extent, thereby leading to a shorter life. Higher holding temperatures above the range can cause the internal electrode layers to be oxidized, which leads to a reduced capacitance, and to react with the dielectric material, which leads to a shorter life. Annealing can be accomplished simply by heating and cooling. In this case, the holding temperature is equal to the highest temperature on heating and the holding time is zero.

The binder removal, firing, and annealing may be carried out either continuously or separately. If done continuously, the process includes the steps of binder removal, changing only the atmosphere without cooling, raising the temperature to the firing temperature, holding the chip at that temperature for firing, lowering the temperature to the annealing temperature, changing the atmosphere at that temperature, and annealing.

If done separately, after binder removal and cooling down, the temperature of the chip is raised to the binder-removing temperature in dry or humid nitrogen gas. The atmosphere then is changed to a reducing one, and the temperature is further raised for firing. Thereafter, the temperature is lowered to the annealing temperature and the atmosphere is again changed to dry or humid nitrogen gas, and cooling is continued. Alternatively, once cooled down, the temperature may be raised to the annealing temperature in a nitrogen gas atmosphere. The entire annealing step may be done in a humid nitrogen gas atmosphere.

The resulting chip may be polished at end faces by barrel tumbling and sand blasting, for example, before the external electrode-forming paste is printed or transferred and baked to form external electrodes. Firing of the external electrode-forming paste may be carried out in an inert nitrogen atmosphere gases at about 600 to 800° C., and about 10 minutes to about 1 hour.

After the monolith is sintered connections to the internal electrodes must be formed by applying termination materials, typically thick film pastes, followed by additional sintering to contact the internal electrodes of the MLCC. This sintering step may be detrimental to the ceramic and/or internal conductors.

The external terminations are preferably formed by dipping with other methods, such as ink-jet spraying being suitable. Once deposited these external terminations are sintered or cured to adhere them to the ceramic and connect to the internal electrodes.

The MLCC can be over-molded by a non-conductive polymer or resin. The material used for overmolding is not particularly limited herein. Overmolding can be done to isolate MLCC from electrical interaction with other elements of a circuit or to protect the package, or components therein, from environmental variations. Overmolding can also be beneficial for labeling and for use with pick-and-place equipment since the over-molding can be applied with specific geometry identifiable by optical or mechanical equipment.

EXAMPLES

Inventive 2-C and 3-C monolithic bodies were formed comprising X7R ceramic as 4.7 μF, 50V capacitive couples.

Figure 16:
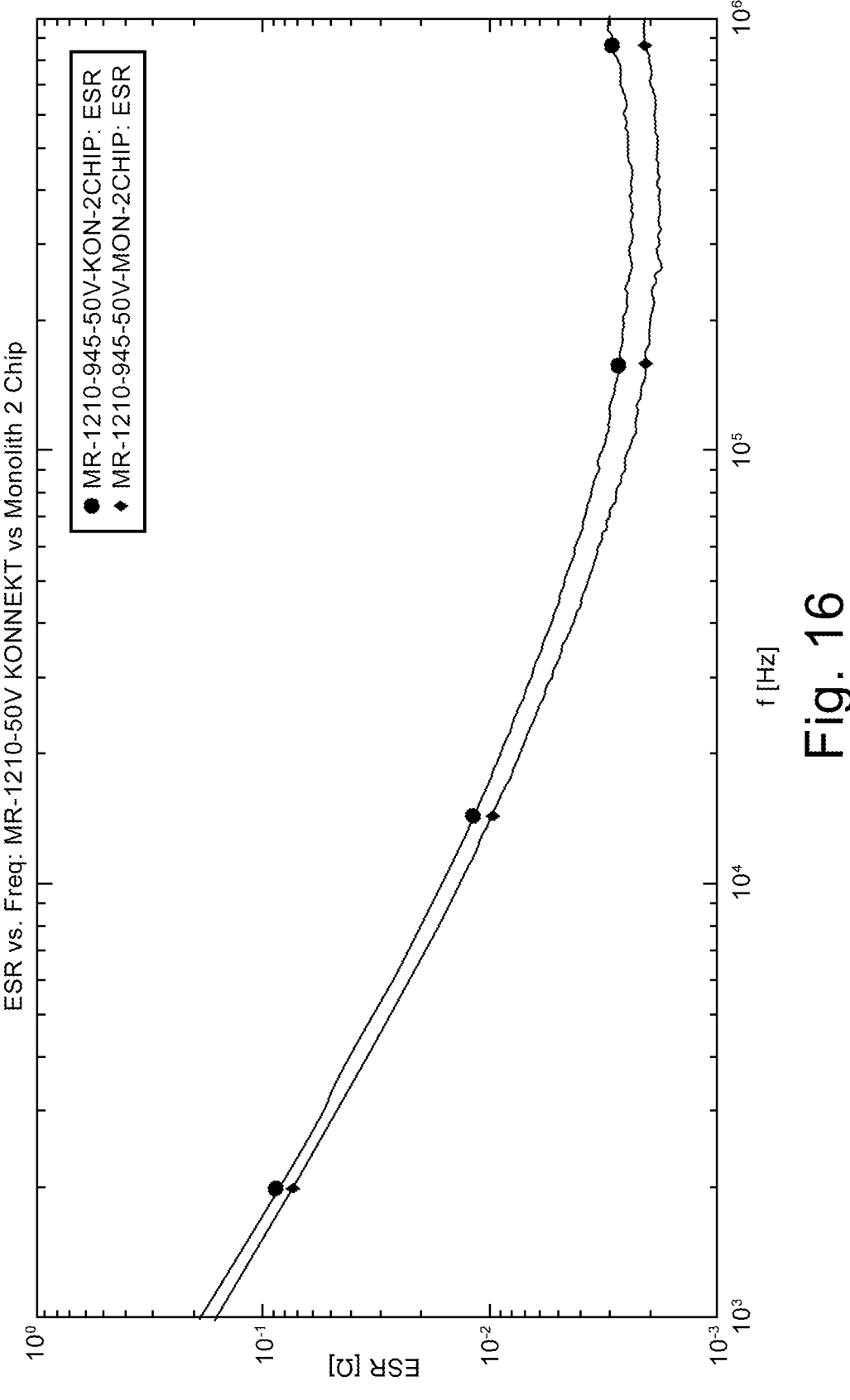
FIG. 16 is a graphical representation of advantages provided by an embodiment of the invention.
Figure 17:
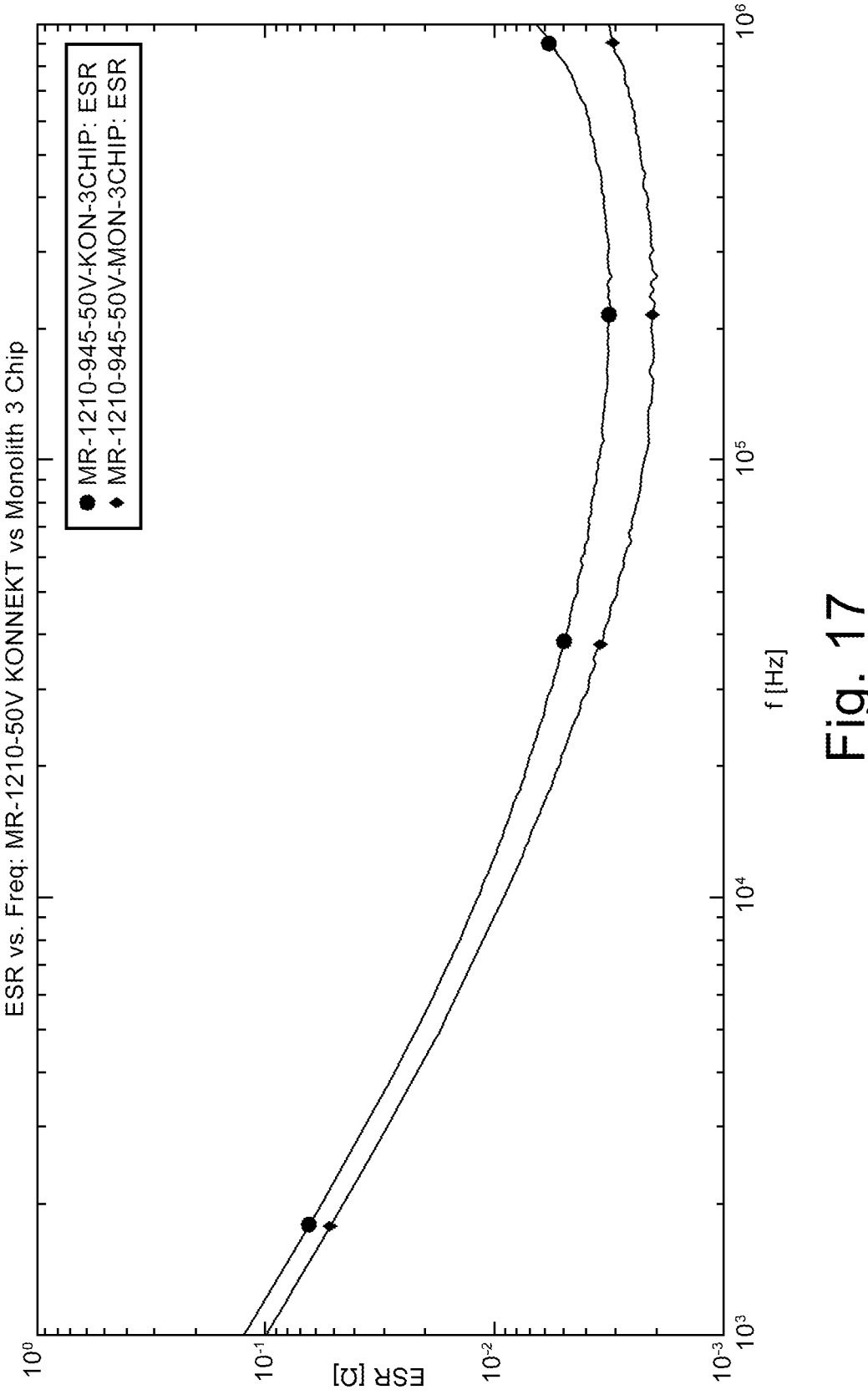
FIG. 17 is a graphical representation of advantages provided by an embodiment of the invention.

Comparative multilayered ceramic capacitors were formed in identical fashion and then formed into a two capacitor leadless stack or a three capacitor leadless stack as described in U.S. Pat. No. 11,227,719. The Equivalent Series Resistance (ESR) of the inventive and comparative capacitors were measured as a function of frequency with the results presented in FIG. 16 for two capacitive couples and FIG. 17 for three capacitive couples. In each case the inventive capacitor illustrated improved ESR as a function of frequency. In addition to the improved ESR the inventive capacitors illustrated improved Equivalent Series Inductance (ESL). For the examples with two capacitive couples the inventive example had an ESL of 204 pH compared to 237 pH for the comparative example. For the examples with three capacitive couples the inventive example had an ESL of 208 pH compared to 224 pH for the comparative example.

The invention has been described with reference to preferred embodiments without limit thereto. One of skill in the art would realize additional embodiments which are described and set forth in the claims appended hereto.

The invention claimed is:

1. A monolithic multilayered ceramic capacitor comprising at least 3 to no more than 22 parallel and offset capacitive couples encased in a continuous ceramic wherein said continuous ceramic further comprises a ceramic separator between adjacent said capacitive couples; wherein each said capacitive couple comprises active electrodes wherein first active electrodes of said adjacent active electrodes of each said capacitive couple are in electrical contact with a first external termination and second active electrodes of said adjacent active electrodes of each said capacitive couple are in electrical contact with a second external termination.

2. The monolithic multilayered ceramic capacitor of claim 1 comprising 3-17 said capacitive couples.

3. The monolithic multilayered ceramic capacitor of claim 2 comprising 3-10 said capacitive couples.

4. The monolithic multilayered ceramic capacitor of claim 3 comprising 3-12 said capacitive couples.

5. The monolithic multilayered ceramic capacitor of claim 4 comprising 3-7 said capacitive couples.

6. The monolithic multilayered ceramic capacitor of claim 5 comprising 3 said capacitive couples.

7. The monolithic multilayered ceramic capacitor of claim 1 further comprising at least one shield layer.

8. The monolithic ceramic capacitor of claim 1 wherein said ceramic comprises at least 92% by weight of barium, calcium, strontium, magnesium, potassium or sodium titanates, zirconates, niobates or tantalates and combinations thereof.

9. The monolithic multilayered ceramic capacitor of claim 1 wherein said ceramic is selected from the group consisting of COG, U2J, X8G, X9G, X7R, X5R, X7S, X7T and X8R.

10. The monolithic multilayered ceramic capacitor of claim 1 wherein said active electrodes comprise a material selected from the group consisting of a base metal and a precious metal.

11. The monolithic multilayered ceramic capacitor of claim 10 wherein said active electrode comprises a material is selected from the group consisting of nickel, copper, palladium, silver, platinum and gold.

12. The monolithic multilayered ceramic capacitor of claim 11 wherein said material is a nickel alloy comprising at least one member selected from the group consisting of Mn, Cr, Co, Al, W, Mo, Sn and Nb.

13. A monolithic multilayered ceramic capacitor comprising at least 3 to no more than 22 parallel and offset capacitive couples encased in a continuous ceramic wherein said continuous ceramic further comprises a ceramic separator between adjacent said capacitive couples; wherein each said capacitive couple comprises active electrodes wherein first active electrodes of said adjacent active electrodes of each said capacitive couple are in electrical contact with a first external termination and second active electrodes of said adjacent active electrodes of each said capacitive couple are in electrical contact with a second external termination wherein each capacitive couple of said capacitive couples comprises adjacent parallel active electrodes.

14. The monolithic multilayered ceramic capacitor of claim 13 wherein said adjacent parallel active electrodes of adjacent capacitive couples are coplanar.

15. The monolithic multilayered ceramic capacitor of claim 13 wherein said adjacent parallel active electrodes are in alternating layers.

16. The monolithic multilayered ceramic capacitor of claim 13 wherein said adjacent parallel active electrodes are in coplanar layers.

17. The monolithic multilayered ceramic capacitor of claim 16 further comprising floating electrodes between said coplanar layers.

18. An electronic device comprising: a circuit board comprises traces; a monolithic multilayered ceramic capacitor comprising at least three capacitive couples comprising active electrodes wherein adjacent active electrodes are in electrical contact with a common external termination wherein the external termination is on a surface of said monolithic multilayered ceramic capacitor and the external termination is in electrical contact with a trace of said traces; and said active electrodes are in at least two parallel and offset stacks encased in a continuous ceramic and said active electrodes are perpendicular to said circuit board.

19. The electronic device of claim 18 wherein said monolithic multilayered ceramic capacitor comprises a monolith with a length L a height H and thickness T wherein the ratio L/T≥1, L/H≥1 and T/H is at least 0.3 to no more than 0.9.

20. The electronic device of claim 18 wherein said monolithic multilayered ceramic capacitor further comprises 3-22 capacitive couples encased in a continuous ceramic wherein said continuous ceramic further comprises a ceramic separator between adjacent said capacitive couples.

21. The electronic device of claim 18 wherein each capacitive couple of said capacitive couples comprises adjacent parallel active electrodes.

22. The electronic device of claim 21 wherein said adjacent parallel active electrodes of adjacent capacitive couples are coplanar.

23. The electronic device of claim 21 wherein said adjacent parallel active electrodes are in alternating layers.

24. The electronic device of claim 21 wherein said adjacent parallel active electrodes are in coplanar layers.

25. The electronic device of claim 24 further comprising floating electrodes between said coplanar layers.

26. The electronic device of claim 18 comprising 3-22 said capacitive couples.

27. The electronic device of claim 26 comprising 3-17 said capacitive couples.

28. The electronic device of claim 27 comprising 3-10 said capacitive couples.

29. The electronic device of claim 28 comprising 3-12 said capacitive couples.

30. The electronic device of claim 29 comprising 3-7 said capacitive couples.

31. The electronic device of claim 30 comprising 3 said capacitive couples.

32. The electronic device of claim 18 wherein the external termination is a partial external termination.

33. The electronic device of claim 32 wherein each said active electrode comprises a tab in electrical contact with said active electrode.

34. The electronic device of claim 18 further comprising at least one shield layer.

35. The electronic device of claim 18 wherein said ceramic comprises at least 92% by weight of barium, calcium, strontium, magnesium, potassium or sodium titanates, zirconates, niobates or tantalates and combinations thereof.

36. The electronic device of claim 18 wherein said ceramic is selected from the group consisting of COG, U2J, X8G, X9G, X7R, X5R, X7S, X7T and X8R.

37. The electronic device of claim 18 wherein said active electrodes comprise a material selected from the group consisting of a base metal and a precious metal.

38. The electronic device of claim 37 wherein said active electrode comprises a material is selected from the group consisting of nickel, copper, palladium, silver, platinum and gold.

39. The electronic device of claim 38 wherein said material is a nickel alloy comprising at least one member selected from the group consisting of Mn, Cr, Co, Al, W, Mo, Sn and Nb.

40. The electronic device of claim 18 wherein said traces are coplanar.

* * * * *